(12) United States Patent
Liang et al.

(10) Patent No.: US 9,117,925 B2
(45) Date of Patent: Aug. 25, 2015

(54) EPITAXIAL PROCESS

(71) Applicant: UNITED MICROELECTRONICS CORP., Hsin-Chu (TW)

(72) Inventors: Chia-Jui Liang, Tainan (TW); Po-Chao Tsao, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 15 days.

(21) Appl. No.: 13/756,464

(22) Filed: Jan. 31, 2013

(65) Prior Publication Data
US 2014/0213028 A1      Jul. 31, 2014

(51) Int. Cl.
| H01L 21/8238 | (2006.01) |
| H01L 21/8234 | (2006.01) |
| H01L 29/66   | (2006.01) |
| H01L 29/78   | (2006.01) |
| H01L 29/165  | (2006.01) |

(52) U.S. Cl.
CPC ...... *H01L 21/823418* (2013.01); *H01L 21/823412* (2013.01); *H01L 21/823468* (2013.01); *H01L 29/165* (2013.01); *H01L 29/66636* (2013.01); *H01L 29/7834* (2013.01); *H01L 29/7848* (2013.01)

(58) Field of Classification Search
CPC .................. H01L 21/823807; H01L 29/66636
See application file for complete search history.

(56) References Cited

U.S. PATENT DOCUMENTS

| 4,891,303 | A | 1/1990 | Garza |
| 5,217,910 | A | 6/1993 | Shimizu |
| 5,273,930 | A | 12/1993 | Steele |
| 5,356,830 | A | 10/1994 | Yoshikawa |
| 5,372,957 | A | 12/1994 | Liang |
| 5,385,630 | A | 1/1995 | Philipossian |
| 5,399,506 | A | 3/1995 | Tsukamoto |
| 5,625,217 | A | 4/1997 | Chau |
| 5,777,364 | A | 7/1998 | Crabbe |
| 5,783,478 | A | 7/1998 | Chau |
| 5,783,479 | A | 7/1998 | Lin |
| 5,960,322 | A | 9/1999 | Xiang |
| 6,030,874 | A | 2/2000 | Grider |
| 6,048,756 | A | 4/2000 | Lee |
| 6,074,954 | A | 6/2000 | Lill |
| 6,100,171 | A | 8/2000 | Ishida |
| 6,110,787 | A | 8/2000 | Chan |
| 6,165,826 | A | 12/2000 | Chau |
| 6,165,881 | A | 12/2000 | Tao |
| 6,191,052 | B1 | 2/2001 | Wang |

(Continued)

OTHER PUBLICATIONS

Rim, Fabrication and Mobility Characteristics of Ultra-thin Strained Si Directly on Insulator (SSDOI) MOSFETs, 2003.

(Continued)

*Primary Examiner* — Zandra Smith
*Assistant Examiner* — Andre' C Stevenson
(74) *Attorney, Agent, or Firm* — Winston Hsu; Scott Margo

(57) ABSTRACT

An epitaxial process includes the following steps. A substrate including a first area and a second area is provided. A first gate and a second gate are formed respectively on the substrate of the first area and the second area. A first spacer and a second spacer are respectively formed on the substrate beside the first gate and the second gate at the same time. A first epitaxial structure is formed beside the first spacer and then a second epitaxial structure is formed beside the second spacer by the first spacer and the second spacer respectively.

9 Claims, 6 Drawing Sheets

(56) References Cited

U.S. PATENT DOCUMENTS

| | | |
|---|---|---|
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,550,336 B2 | 6/2009 | Hsiao |
| 7,554,110 B2 | 6/2009 | Yu |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0023771 A1* | 1/2008 | Romero et al. ............... 257/369 |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2010/0210084 A1* | 8/2010 | Yang et al. ..................... 438/285 |
| 2012/0108021 A1* | 5/2012 | Mehrotra ...................... 438/231 |
| 2012/0315733 A1* | 12/2012 | Huang et al. .................. 438/199 |
| 2013/0302956 A1* | 11/2013 | Flachowsky et al. ......... 438/231 |
| 2013/0316506 A1* | 11/2013 | Chang et al. .................. 438/285 |

OTHER PUBLICATIONS

Oehrlein, Interactive effects in the reactive ion etching of SiGe alloys, May 20, 1991.

* cited by examiner

EPITAXIAL PROCESS

BACKGROUND OF THE INVENTION

1. Field of the Invention

The present invention relates generally to an epitaxial process, and more specifically to an epitaxial process forming spacers at a same time, which are further paired with hard masks to form epitaxial structures.

2. Description of the Prior Art

For decades, chip manufacturers have developed faster metal-oxide-semiconductor (MOS) transistors by making them smaller. As the semiconductor processes advance to very deep sub micron technologies, such as 65-nm node or beyond, how to increase the driving current for MOS transistors has become a critical issue. In order to improve the device performances, crystal strain technology has been developed. Crystal strain technology is becoming more and more attractive as a means for getting better performances in the field of MOS transistor fabrication. Putting a strain on a semiconductor crystal alters the speed at which charges move through that crystal. Strains make the MOS transistors work better by enabling electrical charges, such as electrons, to pass more easily through the silicon lattice of the gate channel. In the known arts, attempts have been made to use a strained silicon layer, which has been grown epitaxially on a silicon substrate with a silicon germanium (SiGe) structure or a silicon carbide (SiC) structure disposed in between. In this type of MOS transistor, a biaxial tensile strain is induced in the epitaxy silicon layer due to the difference of size between the lattice constants of silicon germanium or silicon carbide and silicon. As a result, the band structure is altered, and the carrier mobility is increased. This enhances the speed performances of the MOS transistors. Furthermore, forming epitaxial structures having good electrical performances in a plurality of transistors respectively has become an important issue, especially when forming epitaxial structures with different electrical types.

SUMMARY OF THE INVENTION

The present invention provides an epitaxial process that simultaneously forms spacers on a substrate beside two gates, which are then paired with hard masks to form epitaxial structures having good performances beside the two spacers respectively.

The present invention provides an epitaxial process including the following steps. A substrate including a first area and a second area is provided. A first gate and a second gate are formed on the substrate of the first area and the second area respectively. A first spacer and a second spacer are respectively formed on the substrate beside the first gate and the second gate at the same time. A first epitaxial structure is formed beside the first spacer and then a second epitaxial structure is formed beside the second spacer by the first spacer and the second spacer defining the locations of the first epitaxial structure and the second epitaxial structure respectively.

The present invention provides an epitaxial process including the following steps. A first hard mask is deposited on a second area of a substrate but exposing a first area of the substrate completely. A first epitaxial structure is formed in the exposed first area. A second hard mask is deposited on the substrate of the first area and on the first hard mask of the second area. The second hard mask and the first hard mask in the second area are removed. A second epitaxial structure is formed in the second area. The second hard mask located in the first area is removed.

According to the above, the present invention provides an epitaxial process, which forms a first spacer and a second spacer on a substrate beside a first gate and a second gate respectively, and then sequentially forms a first hard mask and a second hard mask to expose a first area and a second area respectively, so that a first epitaxial structure and a second epitaxial structure can be formed in the first area and the second area respectively. This way, the present invention just needs to perform a wet etching process only once to form the first epitaxial structure and the second epitaxial structure. Compared to performing wet etching processes many times, the first epitaxial structure and the second epitaxial structure formed by the present invention can have improved structures, show less damages of the already formed parts, such as cap layers, simplifications the process and increases the processing throughput.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-11 schematically depict cross-sectional views of an epitaxial process according to an embodiment of the present invention. A gate-last for high-K last process is applied in this embodiment, but the present invention can also use a gate-last for high-K first process, a gate-first process or a polysilicon gate process etc.

Figure 1:
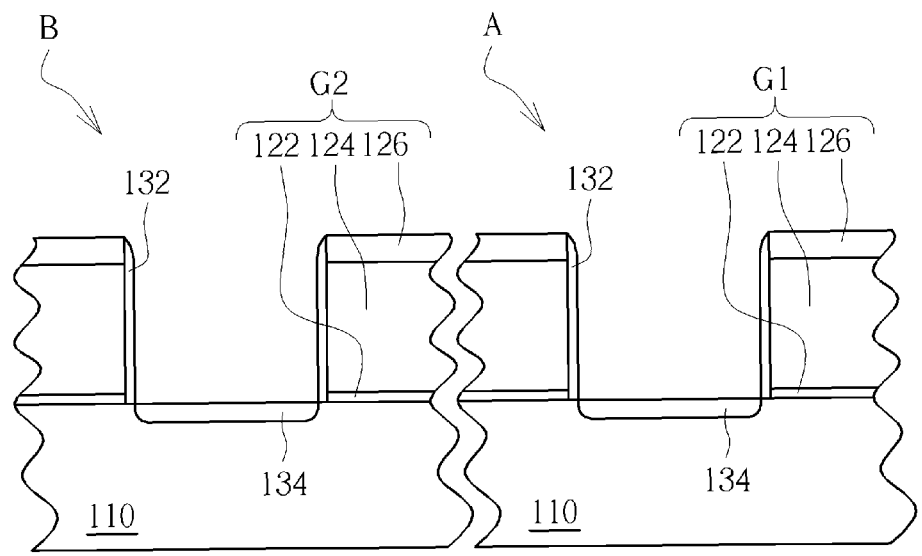
FIGS. 1-11 schematically depict cross-sectional views of an epitaxial process according to an embodiment of the present invention.

As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 includes a first area A and a second area B. In this embodiment, the first area A is a PMOS transistor area and the second area B is an NMOS transistor area, but not limited thereto. In this embodiment, two first gates G1 and two second gates G2 are respectively formed in the first area A and the second area B, wherein each of the first gates G1 and the second gates G2 includes a dielectric layer 122, an electrode layer 124 and a cap layer 126 from bottom to top. The dielectric layer 122 may be an oxide layer, which may be formed through a thermal oxide process or a chemical oxide process etc; the electrode layer 124 may be a silicon layer, and the electrode layer 124 is a sacrificial electrode layer, which will be replaced by a metal gate through a metal gate replacement process due to a gate-last for high-K last process being applied in this embodiment; the cap layer 126 may be a single layer or a dual layer, which may be formed through a nitride layer or/and an oxide layer, but it is not limited thereto. A liner (not shown) may be selectively formed on the substrate 110 beside each of the first gates G1 and the second gates G2, wherein the liner (not shown) may be a nitride layer, but not limited thereto. In this embodiment, two first gates G1 and two second gates G2 are respectively formed in the first area A and the second area B for simplifying and clarifying the present invention, so that later formed epitaxial structures can be depicted completely. In another embodiment, the number of first gates G1 and second gates G2 may range from one to more than two.

Please refer to FIG. 1; two spacers 132 are formed on the substrate 110 beside the first gates G1 and the second gates G2 respectively to define the positions of lightly doped source/drain regions located in the substrate 110 beside the spacers 132. Two lightly doped source/drain regions 134 are respectively formed in the substrate 110 beside the two spacers 132, wherein the dopants of the lightly doped source/drain regions 134 depend upon the electrical types. For example, the first area A may be doped with trivalent ions such as boron, and the second area B may be doped with pentavalent ions such as phosphorous.

Figure 2:
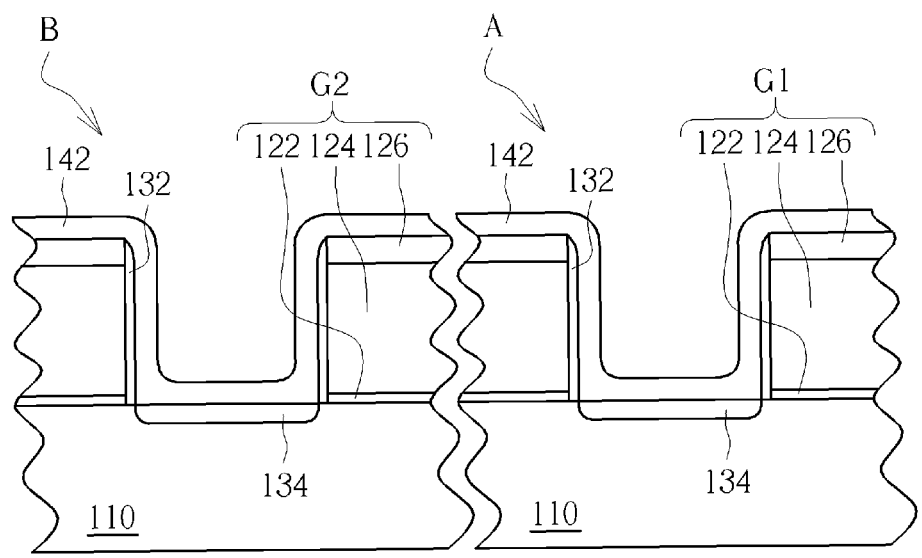
Figure 3:
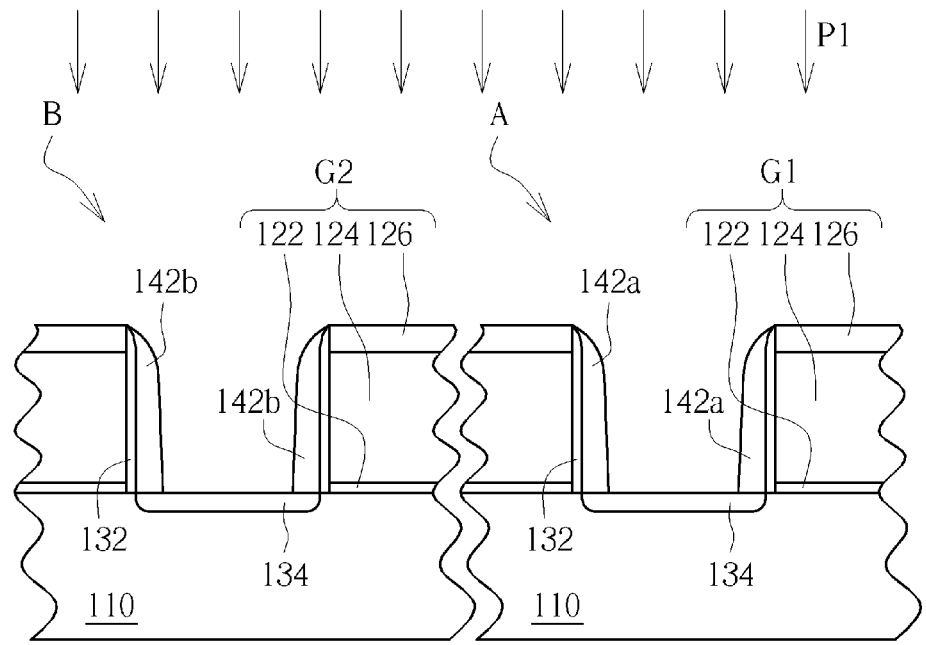

As shown in FIGS. 2-3, a first spacer 142a and a second spacer 142b are formed on the substrate 110 beside the first gates G1 and the second gates G2 respectively. More precisely, a spacer material 142 is entirely deposited on the first gates G1, the second gates G2 and the substrate 110. The spacer material 142 may be a single layer or a dual layer, which may be composed of a nitride layer or/and an oxide layer etc. In this embodiment, the spacer material 142 may be a nitride layer, which may be formed from a precursor of hexachlorosilane (HCD). An etching process P1 is performed to pattern the spacer material 142 to form the first spacer 142a and the second spacer 142b on the substrate 110 beside the first gates G1 and the second gates G2 respectively at the same time. In a preferred embodiment, the etching process P1 is a dry etching process.

Figure 4:
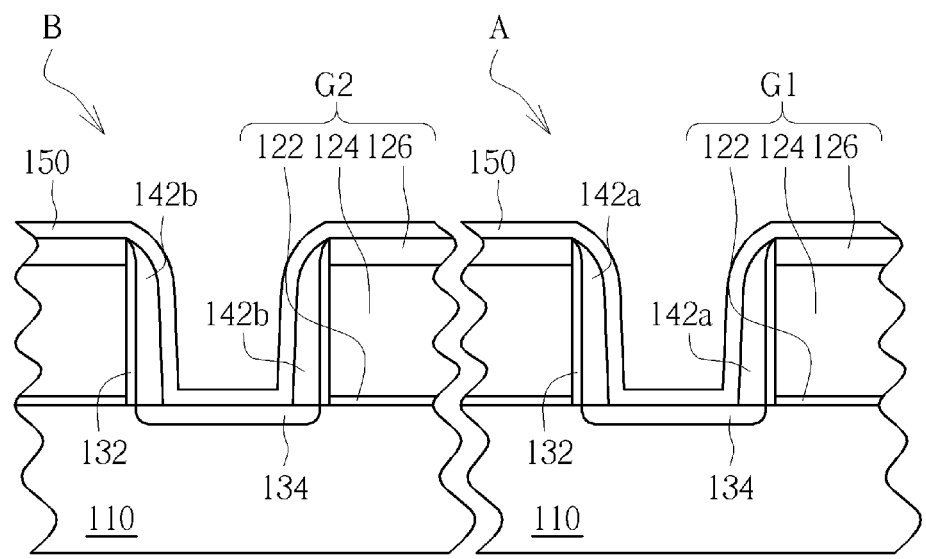
Figure 5:
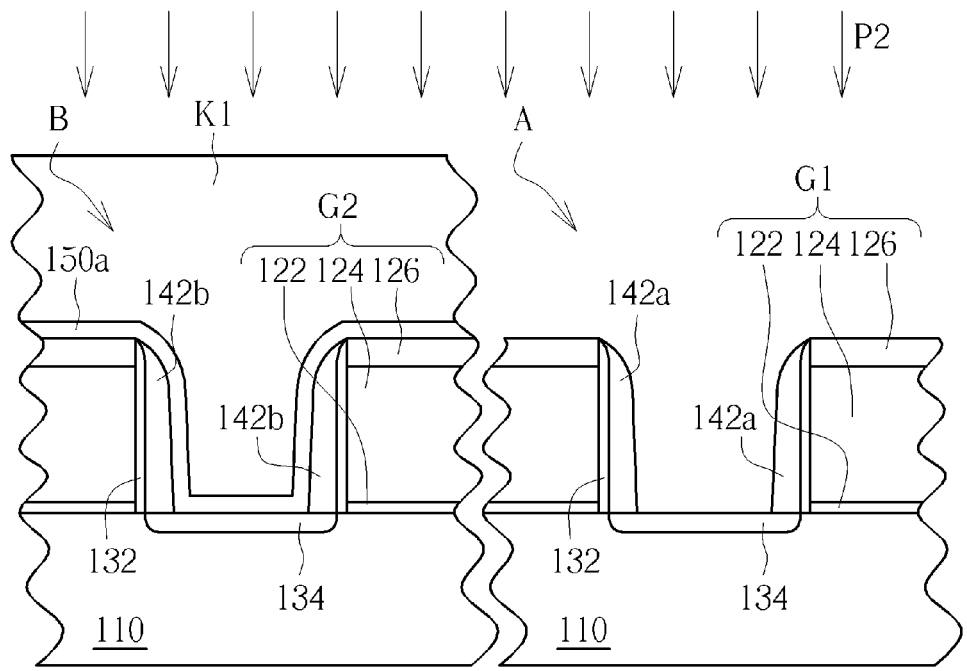

As shown in FIG. 4-5, a patterned first hard mask 150a is formed on the substrate 110 in the second area B but the substrate 110 in the first area A is exposed completely. More precisely, as shown in FIG. 4, a first hard mask layer 150 is entirely deposited on the substrate 110, the first gates G1 and the second gates G2 in the first area A and the second area B. As shown in FIG. 5, a patterned photoresist K1 is formed to cover the second area B. The patterned photoresist K1 may be formed by patterning a blanketly formed photoresist (not shown), but it is not limited thereto. An etching process P2 is performed to remove the first hard mask layer 150 in the first area A but keeping the patterned first hard mask 150a in the second area B, wherein the material of the first hard mask 150 may be a thin oxide layer or a thin nitride layer, and its thickness may be merely 30 angstroms, so as to be removed more easily later, but still suited for being a hard mask while rendering a part of the substrate 110 to be removed to form recesses. The etching process P2 may be a dry etching process or a wet etching process etc. In a preferred embodiment, the etching process P2 is a dry etching process, so as to have a better etched profile.

Figure 6:
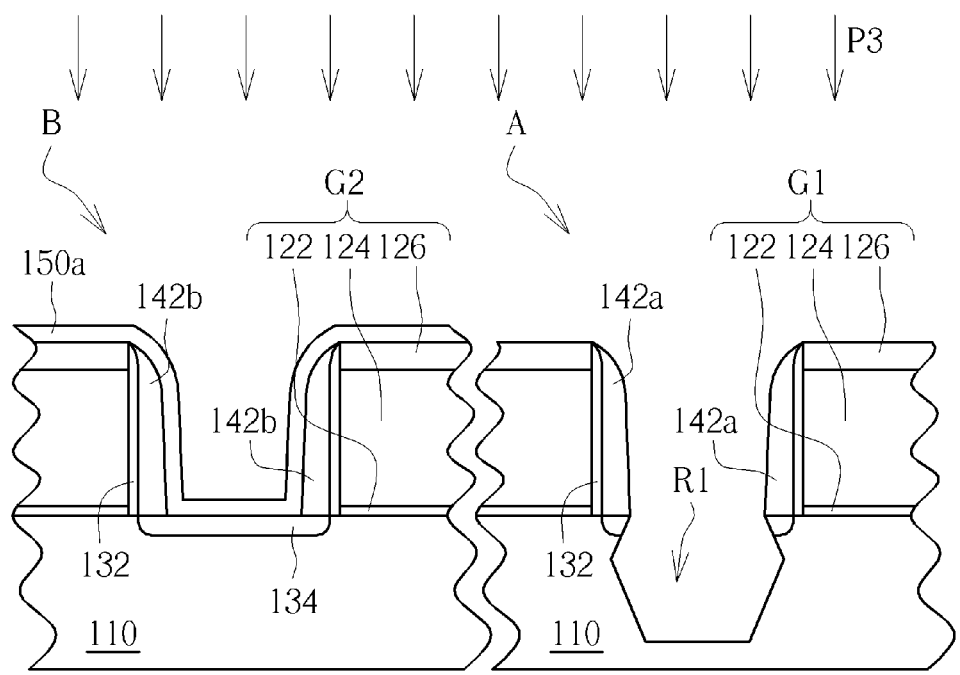
Figure 7:
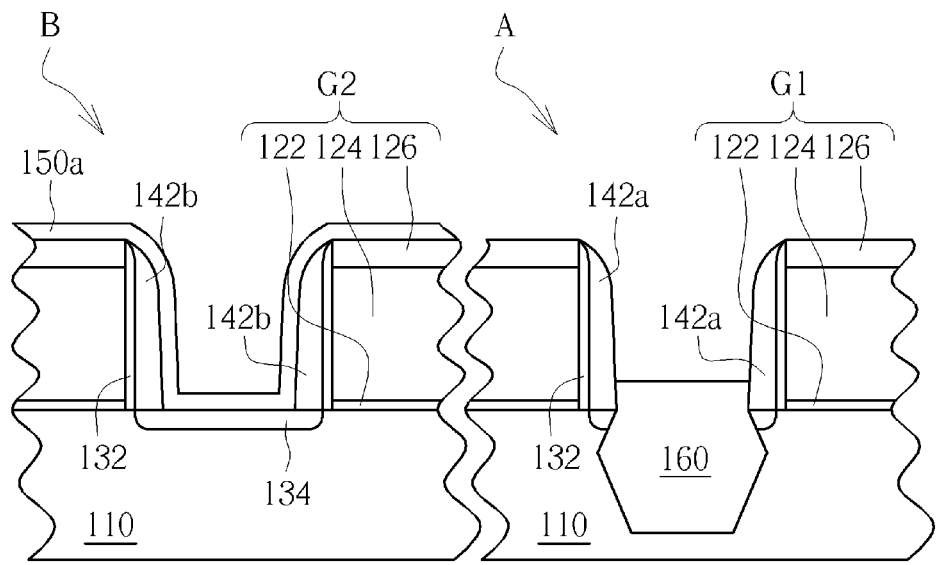

As shown in FIGS. 6-7, a first epitaxial structure 160 is formed beside the first spacer 142a. In this embodiment, the first epitaxial structure 160 is formed in the substrate 110 beside the first spacer 142a. More precisely, as shown in FIG. 6, an etching process P3 is performed to etch the substrate 110 beside the first spacer 142a to form a recess R1 in the substrate 110 of the first area A. Since the first hard mask 150a covers the second area B, the substrate 110 in the second area B will not be etched. Then, the patterned photoresist K1 is removed in the second area B while the first hard mask 150a in the second area B is maintained. As shown in FIG. 7, the first epitaxial structure 160 is formed in the substrate 110 beside the first spacer 142a. In this embodiment, since the first area A is a PMOS transistor area, the first epitaxial structure 160 is an epitaxial structure suited for being used in a PMOS transistor, such as a silicon germanium epitaxial structure. In another embodiment, the first epitaxial structure 160 may be directly formed on the substrate 110 beside the first spacer 142a without etching the substrate 110. Moreover, the high temperature during the formation of the first epitaxial structure 160 can repair the lattice structure damaged while performing the etching process P2 or while etching the recess R1 etc.

Figure 8:
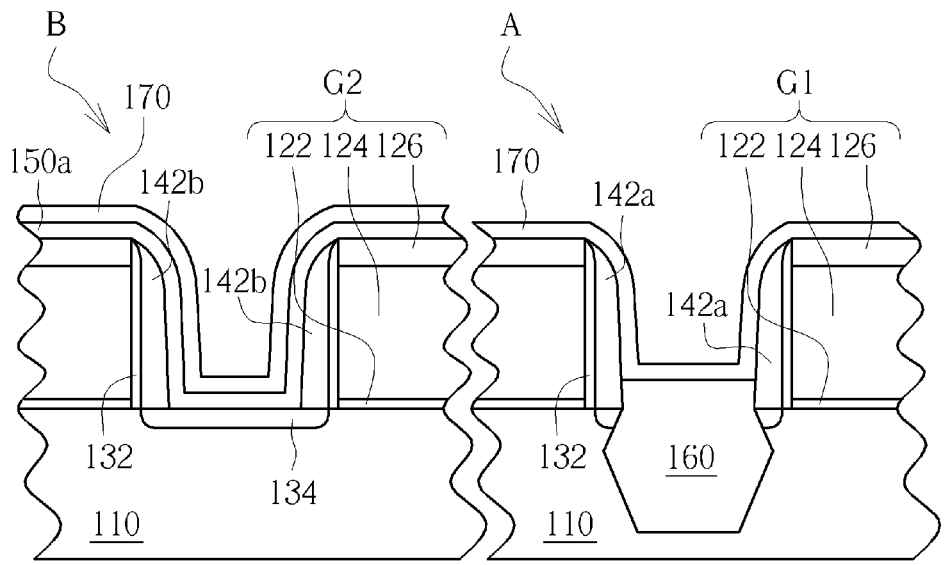

As shown in FIG. 8, a second hard mask layer 170 is deposited on the first epitaxial structure 160, the substrate 110 and the first gates G1 in the first area A, and on the patterned first hard mask 150a in the second area B. The second hard mask layer 170 may be a nitride layer or an oxide layer, but it is not limited thereto. In a preferred embodiment, the second hard mask 170 is a nitride layer, so as to be removed easily and to reduce the damages in the first epitaxial structure 160 below due to the removing of the second hard mask layer 170.

Figure 9:
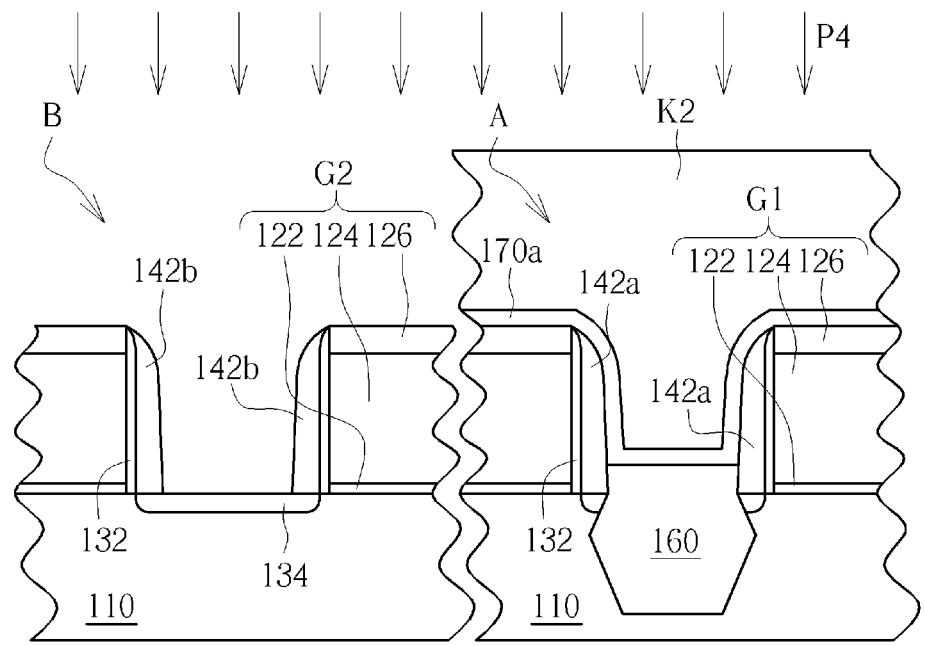
Figure 10:
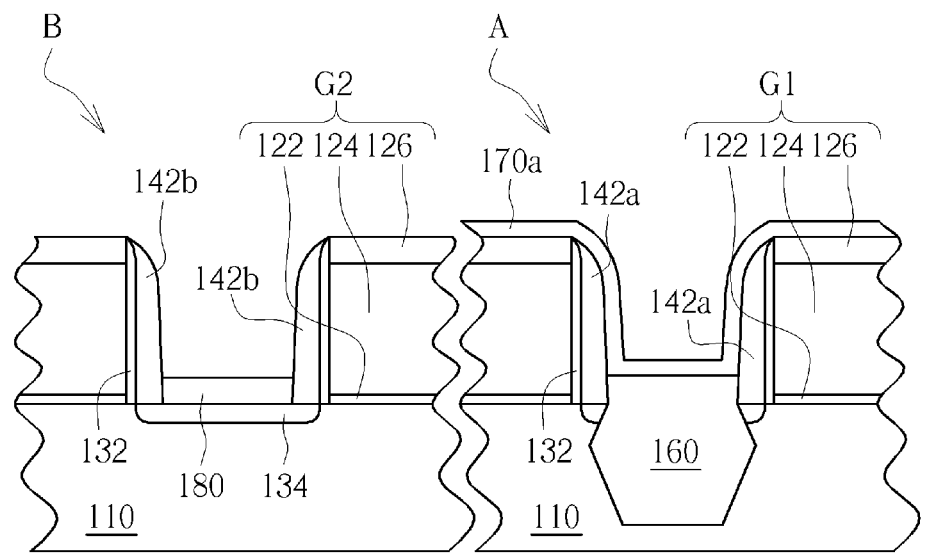

As shown in FIG. 9, a patterned photoresist K2 is formed to cover the first area A, which may be obtained by patterning a blanketly formed photoresist (not shown), but it is not limited thereto. An etching process P4 is performed to remove a part of the second hard mask layer 170 and the first hard mask 150a in the second area B but still maintaining a patterned second hard mask 170a in the first area A. In a preferred embodiment, the etching process P4 is a dry etching process for having better etched profile. Then, the patterned photoresist K2 is removed. Thus, as shown in FIG. 10, a second epitaxial structure 180 is formed on the substrate 110 in the second area B. In this embodiment, the second epitaxial structure 180 is directly formed on the substrate 110 beside the second spacer 142b without etching the substrate 110. Moreover, since the second area B is an NMOS transistor area, the second epitaxial structure 180 is a silicon phosphorous epitaxial structure, especially suited for being used in semiconductor processes lower than 20 nanometers. In another embodiment, the second epitaxial structure 180 may be a silicon carbide epitaxial structure, suited for being used in an NMOS transistor, but it is not limited thereto. In this embodiment, the silicon phosphorous epitaxial structure is directly formed on the substrate 110; in another embodiment, other epitaxial structures may be formed in the substrate 110 beside the second spacer 142b. In other words, an etching process may be performed to form a recess in the substrate 110 beside the second spacer 142b, and then the second epitaxial structure is formed into the recess. This depends upon the practical needs. Furthermore, the high temperature during the formation of the second epitaxial structure 180 can repair the lattice structure damaged while performing the etching process P4 or while etching the recess etc.

Figure 11:
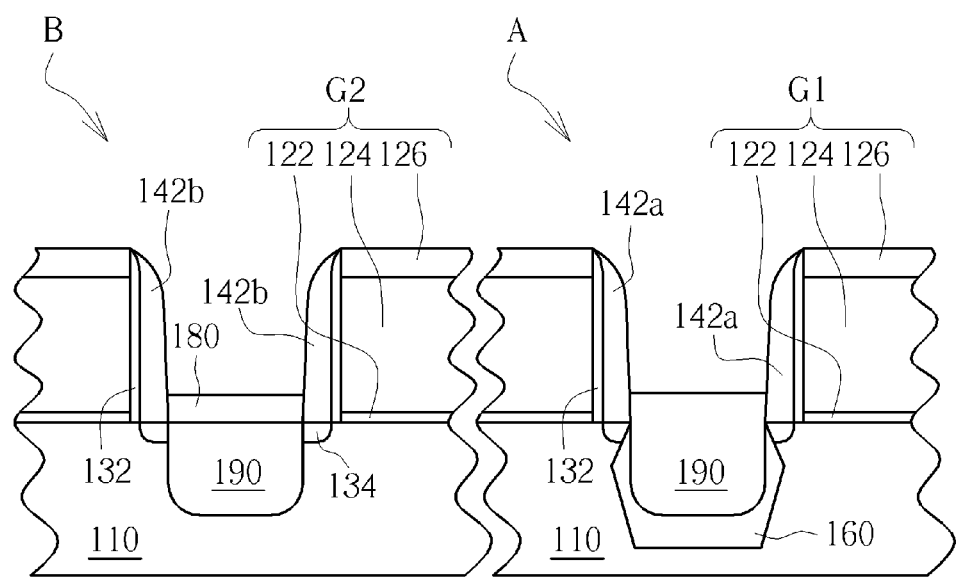

The patterned second hard mask 170a of the first area A is removed, and the first epitaxial structure 160 in the first area A is therefore exposed as shown in FIG. 11. The patterned second hard mask 170a in this embodiment is a nitride layer, so that it can be removed by a hot phosphoric acid containing wet etching process, but it is not limited thereto. This means that the process for forming the first epitaxial structure 160 in the first area A and forming the second epitaxial structure 180 in the second area B is completed.

According to the above, the present invention just needs the hot phosphoric acid containing wet etching process to be performed only once to form the first epitaxial structure 160 and the second epitaxial structure 180 with different electrical types in the first area A and the second area B respectively. Nowadays epitaxial processes still need to perform the hot phosphoric acid containing wet etching processes many times to define and form the first epitaxial structure 160 and the second epitaxial structure 180 respectively. Compared to the previous processes, the hot phosphoric acid containing wet etching process only needs to be performed once in the present invention, thereby reducing the damages of the first epitaxial structure 160 and the second epitaxial structure 180 caused by these etching processes, the structural integrity of the first epitaxial structure 160 and the second epitaxial structure 180 can be maintained, and good electrical performance are achieved. Besides, the damages in the formed parts, such as the cap layer 126, the first spacer 142a and the second spacer 142b, caused by performing these etching processes many times, would expose the electrode layer 124, leading to degrading the qualities of the metal gates formed in a later performed metal gate replacement process, and potential circuit leakages can be reduced in the present invention. Furthermore, the first spacer 142a and the second spacer 142b formed simultaneously in the present invention can simplify the process and increase the processing throughput.

Thereafter, main spacers (not shown) may be selectively formed on the substrate 110 beside the first spacer 142a and the second spacer 142b. An ion implantation process may be performed to form two source/drain regions 190 in the substrate 110 beside the main spacers (not shown) in the first area A and the second area B respectively. The dopants of the source/drain regions 190 may be trivalent ions or pentavalent ions such as boron or phosphorous etc, depending upon the electrical types of the formed semiconductor components and the practical needs. A salicide process may be performed to form a metal silicide (not shown) on the source/drain regions 190 now or after contact hole formation. An interdielectric layer is formed and planarized to entirely cover the substrate 110 and remove the cap layer 126, and the electrode layer 124 is therefore exposed. A metal gate replacement process is performed to remove the electrode layer 124 and the dielectric layer 122, and then a dielectric layer having a high dielectric constant, a barrier layer, a work function metal layer and a low resistivity material etc are filled to replace the first gates G1 and the second gates G2 by metal gates. Contact plugs may be formed in the interdielectric layer and electrically connect the source/drain regions 190. An upper interconnect structures may be formed. And, other semiconductor processes may be performed so on.

To summarize, the present invention provides an epitaxial process, which forms a first spacer and a second spacer on the substrate beside a first gate and a second gate respectively, and then sequentially forms a first hard mask and a second hard mask to expose a first area and a second area respectively, so that a first epitaxial structure and a second epitaxial structure can be formed in the first area and the second area respectively. This way, the present invention just needs a wet etching process to be performed only once to form the first epitaxial structure and the second epitaxial structure. Compared to performing many wet etching processes, the first epitaxial structure and the second epitaxial structure formed by the present invention can have improved structures (especially for silicon germanium epitaxial structures with high concentration, which are easily etched by wet etching processes with etchants of hot phosphoric acid). Besides, the damages in the formed parts, such as the cap layer, the first spacer and the second spacer, caused by performing theses etching processes, that would expose the electrode layer 124, leading to degrading the qualities of the metal gates formed in a later performed metal gate replacement process and circuit leakages may occur, can be reduced in the present invention. Furthermore, the first spacer and the second spacer formed simultaneously in the present invention can simplify the process and increase the processing throughput.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An epitaxial process, comprising:
   depositing a first hard mask on a second area of a substrate but exposing a first area of the substrate completely;
   forming a first epitaxial structure in the exposed first area;
   depositing a second hard mask on the substrate of the first area and on the first hard mask of the second area;
   removing the second hard mask and the first hard mask in the second area;
      forming a second epitaxial structure in the second area; and
   removing the second hard mask of the first area.

2. The epitaxial process according to claim 1, wherein the first area comprises a PMOS transistor area and the second area comprises a NMOS transistor area.

3. The epitaxial process according to claim 1, further comprising: respectively forming a first spacer and a second spacer on the substrate of the first area and the second area before the first hard mask is deposited, in order to define the positions of the first epitaxial structure and the second epitaxial structure.

4. The epitaxial process according to claim 3, further comprising:
   forming two spacers on the substrate of the first area and the second area respectively before the first spacer and the second spacer are formed simultaneously; and
   forming two lightly doped source/drain regions in the substrate beside the two spacers respectively by defining the two lightly doped source/drain regions through the two spacers.

5. The epitaxial process according to claim 1, wherein the step for depositing the first hard mask comprises:
   entirely depositing the first hard mask on the substrate of the first area and the second area;
   forming a patterned photoresist to cover the second area; and
   performing an etching process to remove the first hard mask in the first area.

6. The epitaxial process according to claim 1, wherein the second hard mask and the first hard mask all comprise a nitride layer or an oxide layer.

7. The epitaxial process according to claim 1, wherein the second hard mask and the first hard mask are removed by performing a dry etching process.

8. The epitaxial process according to claim 1, wherein the second hard mask comprises a nitride layer and the second hard mask in the first area is removed by performing a hot phosphoric acid containing wet etching process.

9. The epitaxial process according to claim 1, further comprising: forming two source/drain regions in the substrate of the first area and the second area respectively.

* * * * *